(12) United States Patent
Ju

(10) Patent No.: US 11,545,051 B2
(45) Date of Patent: Jan. 3, 2023

(54) MICROCONTROLLER BOARD FOR THE LEARNING AND PRACTICE OF CODING

(71) Applicant: Hanoi Ju, Gunpo-si (KR)

(72) Inventor: Hanoi Ju, Gunpo-si (KR)

( * ) Notice: Subject to any disclaimer, the term of this patent is extended or adjusted under 35 U.S.C. 154(b) by 972 days.

(21) Appl. No.: 16/295,005

(22) Filed: Mar. 7, 2019

(65) Prior Publication Data

US 2020/0051461 A1    Feb. 13, 2020

(30) Foreign Application Priority Data

Aug. 13, 2018    (KR) ........................ 10-2018-0094421

(51) Int. Cl.
| | | |
|---|---|---|
| G09B 23/18 | (2006.01) | |
| H05K 1/11 | (2006.01) | |
| H05K 1/18 | (2006.01) | |
| H05K 3/42 | (2006.01) | |

(52) U.S. Cl.
CPC ........... G09B 23/186 (2013.01); H05K 1/115 (2013.01); H05K 1/181 (2013.01); H05K 3/428 (2013.01); H05K 2201/10212 (2013.01)

(58) Field of Classification Search
CPC ........ H05K 1/115; H05K 1/181; H05K 3/428; H05K 2201/10212; H05K 2201/09036; H05K 3/0052; H05K 3/42; G09B 23/186; G09B 23/183; G09B 23/18
See application file for complete search history.

(56) References Cited

U.S. PATENT DOCUMENTS 5,557,299 A * 9/1996 Maynard ................ G06F 3/023
341/24

FOREIGN PATENT DOCUMENTS

| JP | H08-023149 A | 1/1996 | |
|---|---|---|---|
| KR | 10-1790435 B1 | 10/2017 | |
| KR | 20180009834 A * | 1/2018 | ........... G09B 23/186 |
| KR | 20180026714 A * | 3/2018 | ........... G09B 23/186 |
| KR | 10-1870531 B1 | 6/2018 | |

* cited by examiner

Primary Examiner — Jasmine J Clark
(74) Attorney, Agent, or Firm — KORUS Patent, LLC; Seong Il Jeong

(57) ABSTRACT

Disclosed herein is a microcontroller board for the learning and practice of coding. In the microcontroller board, a platform area (S1) including a platform circuit board (10) in which a microcontroller is provided and module areas (S2) each having a cut line and including a module circuit board (20) are divided and formed on a single board array (S), corresponding header socket holes H are formed in the platform area (S1) including the platform circuit board (10) and the module areas (S2) on both sides of each of the cut lines, a plurality of machine holes (30) is provided along each of the cut lines between the header socket holes (H), via holes (40) are formed by plating the inner circumferential surfaces of the machine holes (30) with metal layers (35) in order to conduct electricity, and V-cut grooves (50) are formed along each of the cut lines.

3 Claims, 3 Drawing Sheets

MICROCONTROLLER BOARD FOR THE LEARNING AND PRACTICE OF CODING

CROSS-REFERENCE TO RELATED APPLICATION

This application claims the benefit of Korean Patent Application No. 10-2018-0094421 filed on Aug. 13, 2018, which is hereby incorporated by reference herein in its entirety.

BACKGROUND

1. Technical Field

The present invention relates generally to a microcontroller board for the learning and practice of coding, and more specifically to a microcontroller board for the learning and practice of coding, which is configured to combine a platform circuit board representative of microcontroller boards, such as an Arduino board, and various module circuit boards applicable to the platform circuit board into a single board array and to electrically connect the platform and the module circuit boards to one another, thereby enabling whether electronic devices have been electrically connected to each other to be conveniently checked and thus improving training and practice effects.

2. Description of the Related Art

In general, boards chiefly used for training purposes include an Arduino board, the Micro Bit, an STM32 controller board, and other microcontrollers. These boards provide boards that can be simply fabricated for the purpose of providing the coding training and creativity cultivation of students or beginners.

In this case, an Arduino board, which is the most popular of all the above boards, refers to a microcontroller unit (MCU) that is based on easy-to-use open source. The microcontroller unit provides an easy-to-use development tool and a USB-based connection interface so that common people can easily carry out development.

The microcontroller unit may be described as a small-sized computer that is formed of a single chip so that the microcontroller unit is equipped with a processor and memory and performs a series of steps of receiving an electrical signal, performing a task by means of the CPU core of the processor and the memory, and outputting the result of the performance in the form of an electric signal.

Furthermore, the program sources, circuit diagrams, and hardware control technologies related to the Arduino board have been disclosed over the Internet, and thus the Arduino board enables applications to be easily created without a professional knowledge of hardware or software. Moreover, a large number of projects that can be performed using the Arduino board have been disclosed in the form of open sources, and thus the program sources can be used, modified, duplicated, and distributed without copyright infringement. Additionally, desired functions can be more easily implemented using a program called "Sketch (a source code used to control Arduino functions)."

Furthermore, hardware designs for Arduino hardware are shared such that the hardware designs can be used by other people. Platform products (representatively, UNO, Leonardo, and Mega) can be fabricated using the hardware designs and then sold to other people, and a large number of Arduino compatible boards are present.

In particular, the Arduino board is most advantageous in that it can receive inputs from a large number of switches or sensors and can easily operate a microcontroller configured to perform the control of electric devices, such as the control of a motor and the selective turning on and off of an LED.

Furthermore, the Arduino board enables a desired function to be added to its platform via an Arduino shield. The shield is a board configured to be selectively inserted into the upper end of a platform circuit board, and serves to expand functionality. For example, when it is desirable to add an Internet access function to the Arduino board, an Ethernet module shield can be used. Meanwhile, when it is desirable to add a wireless Internet access function to the Arduino board, a WiFi module shield can be used.

In order to control various devices by using the Arduino board, lots of training and practice are required. For this purpose, a student or trainee needs to perform the burdensome process of preparing various electronic devices responsible for input/output, such as a motor, an LED, a sensor, a resistor, a diode, a switch, etc. and electronic materials and tools, such as a soldering machine, electric wires, a solder suction machine, etc. and then electrically connecting the prepared electronic devices to the Arduino board. Furthermore, a trainee also needs to perform the complicated process of connecting the Arduino board with an external computer PC via a universal serial bus (USB) in order to develop a program.

In this case, in order to electrically connect the electronic devices to the Arduino board, soldering work is required. However, during soldering work, an electronic device may be damaged due to overheating attributable to the poor use of soldering technology, or an electronic device may be soldered to a gap at a wrong location due to the erroneous determination of the location of the gap of the Arduino board. In these cases, burdensomeness arises in that the attached solder needs to be re-melted and removed due to the non-operation or erroneous operation of an electronic circuit, or a problem arises in that an electronic device and a board are exposed to a large amount of heat and damaged.

Accordingly, during the process of researching, learning, and practicing the Arduino board, a bread board has been used to check whether electronic devices have been correctly connected. However, the gap holes of the bread board are excessively small, and thus it is difficult for beginners to understand circuits by means of the bread board and it is also difficult to use the bread board for the training of young students.

Furthermore, in schools and academies where various types of practice are carried out, it is difficult to prepare various control devices and the Arduino board required for the practice. Furthermore, problems arise in that practice is burdensome and requires a long period of time because a trainee needs to perform programming by means of a separate PC equipped with an integrated development environment, to upload machine language code, completed as described above, to the memory of the Arduino board, to separate the Arduino board from the computer when it is necessary to determine whether various types of control devices operate normally, and to re-connect the Arduino board to the computer and disconnect the Arduino board from the computer when it is necessary to re-install or modify a program.

PRIOR ART DOCUMENT

Patent Document (Patent document 1) Korean Patent No. 10-1870531 entitled "Arduino Practice Jumper Cable, Control Board and Bread board Using Magnetic Force, and Educational Arduino Practice Kit Using the Same" (registered on Jun. 18, 2018)

SUMMARY

The present invention has been conceived to overcome the above-described problems, and an object of the present invention is to combine a platform circuit board representative of microcontroller boards, such as an Arduino board, and various module circuit boards applicable to the platform circuit board into a single board array and to electrically connect the platform and the module circuit boards to one another, thereby enabling whether electronic devices have been electrically connected to each other to be conveniently checked and thus enabling training and practice to be facilitated.

Another object of the present invention is to allow a platform circuit board and module circuit boards constituting a board array to be separated after checking whether the platform circuit board and the module circuit boards have been electrically connected, thereby enabling the platform circuit board and the module circuit boards to be combined in accordance with their intended use and thus improving a learning effect.

Still another object of the present invention is to include a platform circuit board and module circuit boards in a single board array, thereby improving the convenience of surface mounting work on the board array and simplifying the process of the surface mounting work and thus reducing manufacturing cost and improving marketability.

In order to accomplish the above objects, the present invention provides a microcontroller board for the learning and practice of coding, wherein:

a platform area (S1) including a platform circuit board (10) in which a microcontroller is provided and module areas (S2) each having a cut line and including a module circuit board (20) are divided and formed on a single board array (S);

corresponding header socket holes H are formed in the platform area (S1) including the platform circuit board (10) and the module areas (S2) on both sides of each of the cut lines; and a plurality of machine holes (30) is provided along each of the cut lines between the header socket holes (H), via holes (40) are formed by plating the inner circumferential surfaces of the machine holes (30) with metal layers (35) in order to conduct electricity, and V-cut grooves (50) are formed along each of the cut lines.

Module supports (21) may be successively provided in each of the modules areas (S2) at intervals, and a plurality of module circuit boards (20) that is connected to the module supports (21) via module connection portions (22) may be formed in spaces between the module supports (21); and a plurality of machine holes (30) may be provided along each of cut lines that divide the module supports (21) and the module circuit boards (20) from each other, via holes (40) may be formed by plating the inner circumferential surfaces of the machine holes (30) with metal layers (35) in order to conduct electricity, and V-cut grooves (50) may be formed along each of the cut lines.

Parts may be mounted on the platform circuit board (10) and the module circuit boards (20) divided by the cut lines on the board array (S), whether the parts have been electrically connected to each other may be checked, and the platform circuit board (10) and the module circuit boards (20) may be separated from the board array (S) and then used.

The metal layers (35) with which the inner circumferential surfaces of the machine holes (30) are plated may be made of are plated may be made of any one of copper-, silver-, gold-, nickel-, and carbon-series materials applied using an electrolytic or electroless plating method.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

A microcontroller board for the learning and practice of coding according to the present invention is configured to combine a platform circuit board representative of microcontroller boards, such as an Arduino board, and various module circuit boards applicable to the platform circuit board into a single board array and to electrically connect the platform and the module circuit boards to one another, thereby enabling whether electronic devices mounted on the circuit boards have been electrically connected to one another to be conveniently checked and thus improving training and practice effects.

The configuration of the microcontroller board for the learning and practice of coding according to the present invention will be clearly understood from embodiments that will be described in detail below with reference to the accompanying drawings.

The present invention may be subject to various modifications, and may have various forms. Embodiments will be described in detail below. However, this is not intended to limit the present invention to specific forms, and it will be understood that all modifications, equivalents, and substitutions falling within the technical spirit and scope of the present invention are included in the scope of the present invention.

First, it is noted that although the microcontroller board according to the present invention is described as being a representative Arduino circuit board as an example, it may be applied to other boards used for learning and practice. A board array S is configured such that a copper film-stacked plate is formed by applying copper films on both surfaces of a board insulator, micro-circuits are formed on the copper film-stacked plate by using a well-known method, and the outer surfaces of the copper film-stacked plate are provided with insulating layers, thereby reducing manufacturing cost.

Figure 1:
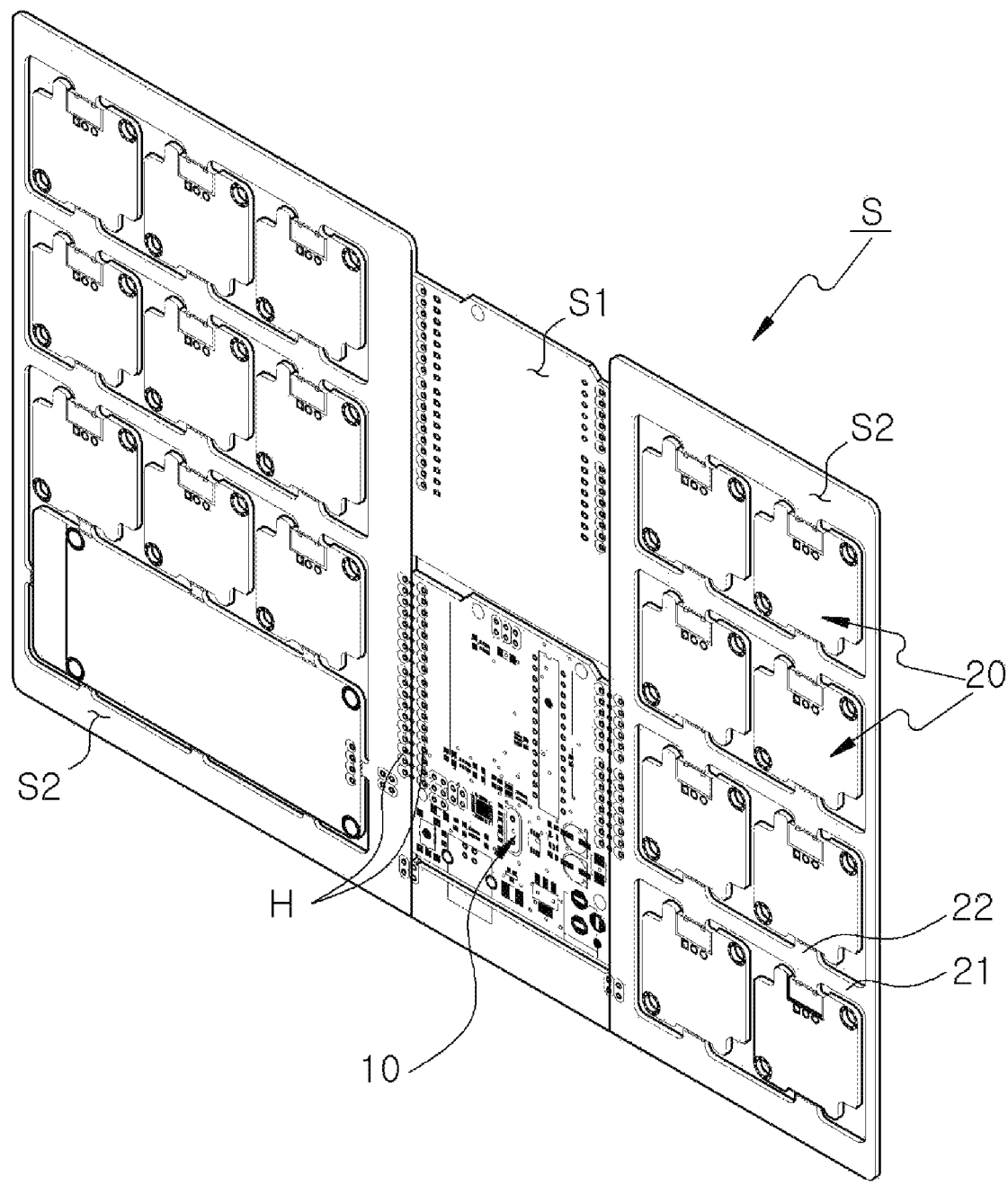
FIG. 1 is a perspective view of a microcontroller board for the learning and practice of coding according to the present invention.
Figure 2:
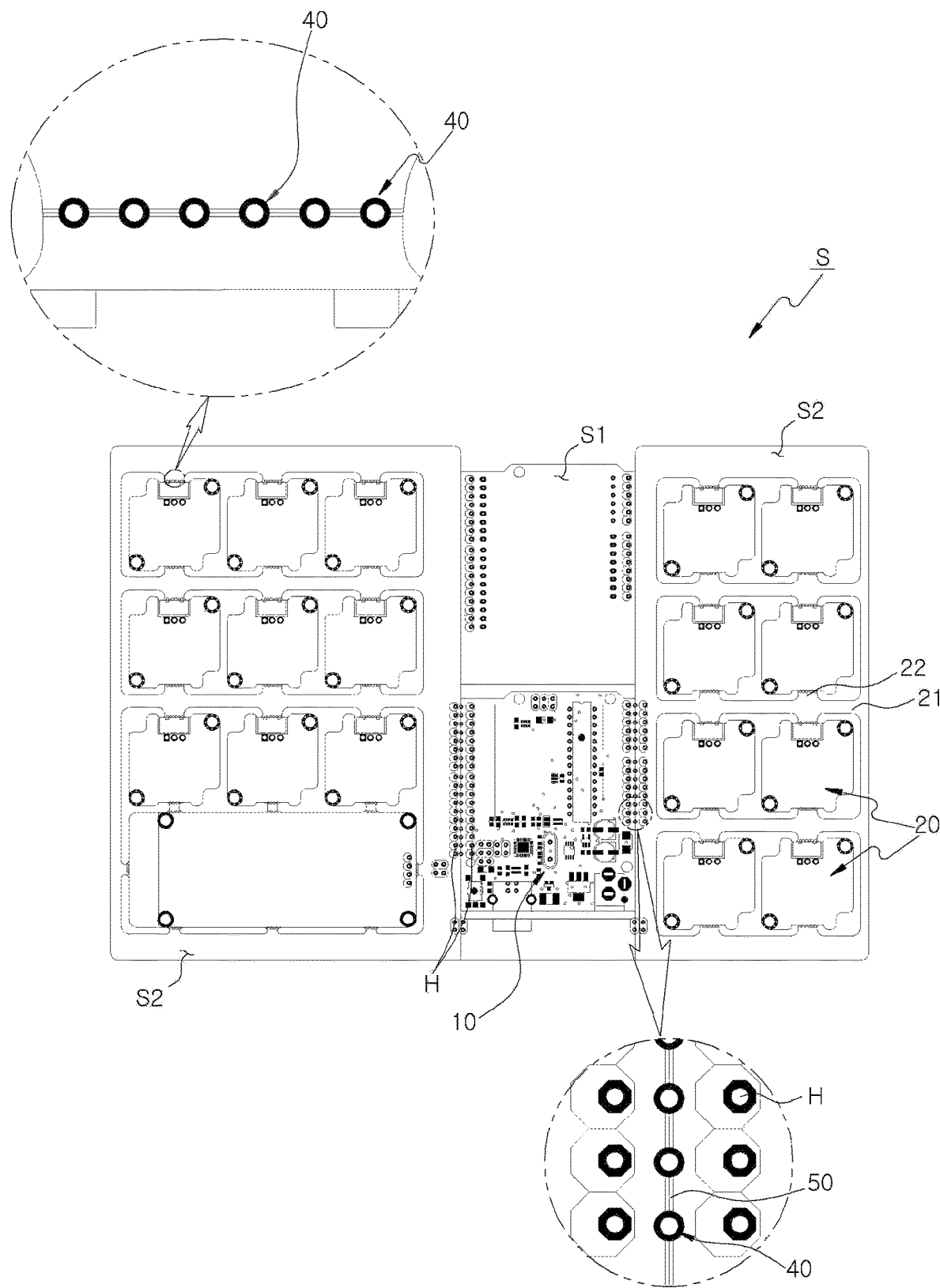
FIG. 2 is a front view of the microcontroller board for the learning and practice of coding according to the present invention.

As shown in FIGS. 1 and 2, according to the present invention, a platform area S1 including a platform circuit board 10 where a microcontroller is provided and module areas S2 each having a cut line and including module circuit boards 20 are divided and formed on a single board array S.

In this case, the platform area S1 in which there is located the platform circuit board 10 which is any one of representative known Arduino products each including a processor and memory is formed in the center of the board array S, and the module areas S2 in each of which there is included the shield platform-type module circuit board 20 to which a trainee may add one or more desired functions, such as a motor, a sensor, an LED, and/or the like, are formed on both sides of the platform area S1.

The platform area S1 including the platform circuit board 10 and the module areas S2 are divided from each other by cut lines. Header socket holes H into which header sockets (not shown) are mounted are formed on both sides of the platform circuit board 10. Corresponding header socket holes H are formed in each of the module areas S2 on the opposite side of a corresponding one of the cut lines.

Figure 3:
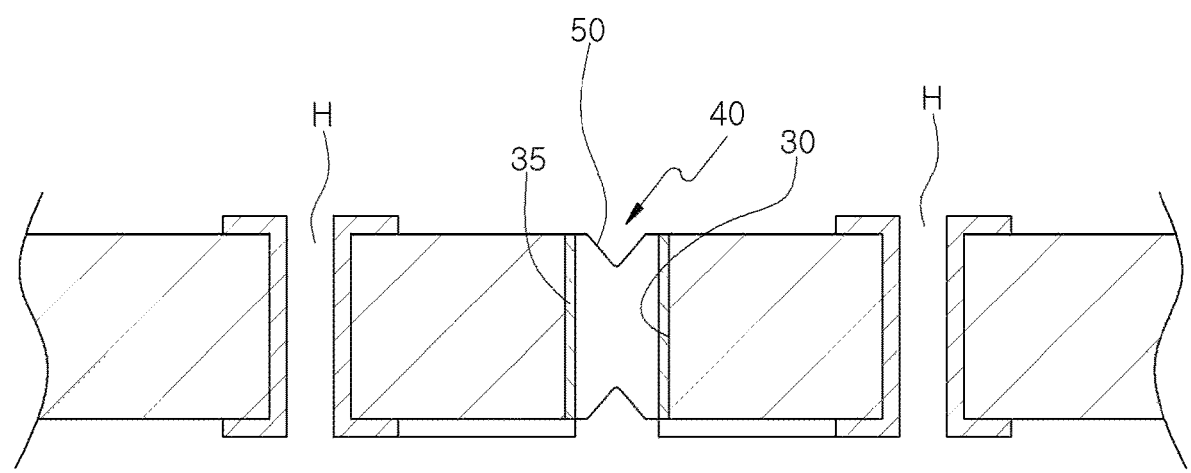
FIG. 3 is an enlarged sectional view of a connection portion that connects a platform area and a module area with each other according to the present invention.

Furthermore, the present invention is chiefly characterized in that a plurality of machine holes 30 is provided on a cut line between the header socket holes H and via holes 40 are formed by plating the inner circumferential surfaces of the machine holes 30 with metal layers 35 in order to conduct electricity, as shown in FIG. 3.

The metal layers 35 with which the inner circumferential surfaces of the machine holes 30 are plated may be made of any one of copper-, silver-, gold-, nickel-, and carbon-series materials applied using an electrolytic or electroless plating method.

In this case, it is natural that the number of header socket holes H and the number of machine holes 30 are the same, and it is important that the micro-circuits of the header socket holes H and the metal layers 35 of the via holes 40 are connected to each other in order to conduct electricity.

In the state where the header socket holes H and the via holes 40 have been connected in order to conduct electricity, a V-cut groove 50 is formed along each of the cut lines on a single surface or both surfaces. It is preferable to determine the depth of the cut groove in order to enable electricity to be conducted through the via holes 40 while enabling separation to be performed along the cut line after learning and practice using the circuit board.

In other words, the via holes 40 having the respective metal layers 35 are formed along each of the cut lines. The platform area S1 including the platform circuit board 10 and the module areas S2 including the module circuit boards 20 are connected in order to conduct electricity. Although the V-cut grooves 50 are formed at the centers of the via holes 40 along the cut lines, the via holes 40 are formed in such a manner that the overall inner circumferential surfaces of the machines hole 30 are plated with the metal layers 35. Accordingly, the state in which the areas have been connected in order to conduct electricity may be maintained, and also the areas may be easily separated from each other via the V-cut grooves 50 after practice.

Furthermore, at least one representative platform product, which is an Arduino circuit board, is formed in the platform area S1. Accordingly, when both the module areas S2 are separated, the platform circuit board 10 may be easily separated and used. A plurality of module circuit boards 20 configured to apply various functions to the platform circuit board 10 is provided in each of the module areas S2. Accordingly, each of the module circuit boards 20 may be separated after learning and a circuit abnormality test.

For this purpose, module supports 21 are successively provided in each of the module areas S2 at intervals, the plurality of module circuit boards 20 that are connected to the module supports 21 by means of module connection portions 22 are formed in the spaces between the module supports 21, and a plurality of machine holes 30 is provided along each of cut lines by which the module supports 21 and the module circuit boards 20 are separated from each other.

Furthermore, as described above, the via holes 40 are formed by plating the inner circumferential surfaces of the machine holes 30 with the metal layers 35 in order to conduct electricity, and then the V-cut grooves 50 are formed along the cut lines, thereby enabling the module circuit boards 20 to be easily separated after practice.

In this case, the cut lines having the V-cut grooves 50 are formed in the module connection portions 22 connecting the module supports 21 and module circuit boards 20 of the module area S2, and a plurality of machine holes 30 is formed on each of the cut lines. Via holes 40 may be formed by selectively plating the machine holes 30 with the metal layers 35. As an example, a case where in the state in which each of the module circuit boards 20 has been fastened by the module connection portions 22 on both sides of the module circuit board 20, via holes 40 that are electrically connected to machine holes 30, provided on the cut line on any one of the sides, via header socket holes and micro-circuits are formed, and then electric connection is performed is included in the present invention.

Parts are mounted on the platform circuit board 10 and the module circuit boards 20 divided by the cut lines on the board array S, whether the parts have been electrically connected to each other is checked, and the platform circuit board 10 and then the module circuit boards 20 are separated from the board array (S) and then used, thereby improving a training effect for the learning and practice of a trainee.

According to the present invention, the platform circuit board representative of microcontroller boards, such as an Arduino board, and the various module circuit boards applicable to the platform circuit board are combined into a single board array and the platform and the module circuit boards are electrically connected to one another, thus whether electronic devices have been electrically connected to each other is enabled to be conveniently checked, thereby improving a training effect.

Furthermore, the platform circuit board and the module circuit boards constituting the board array are allowed to be separated after checking whether the platform circuit board and the module circuit boards have been electrically connected, and thus the platform circuit board and the module circuit boards are enabled to be combined in accordance with their intended use, thereby improving a practice effect.

Moreover, the platform circuit board and the module circuit boards are included in the single board array, and thus the convenience of surface mounting work on the board array is improved and the process of the surface mounting work is simplified, thereby reducing manufacturing cost and improving marketability.

While the present invention has been described in conjunction with the preferred embodiments, the present invention is not limited to the embodiments. It will be apparent to those skilled in the art that various modifications and alterations may be made without departing from the technical spirit of the present invention.

What is claimed is:

1. A microcontroller board for the learning and practice of coding, wherein:
   a platform area (S1) including a platform circuit board (10) in which a microcontroller is provided and module areas (S2) each having a cut line and including a module circuit board (20) are divided and formed on a single board array (S);

corresponding header socket holes H are formed in the platform area (S1) including the platform circuit board (10) and the module areas (S2) on both sides of each of the cut lines; and a plurality of machine holes (30) is provided along each of the cut lines between the header socket holes (H), via holes (40) are formed by plating inner circumferential surfaces of the machine holes (30) with metal layers (35) in order to conduct electricity, and V-cut grooves (50) are formed along each of the cut lines.

2. The microcontroller board of claim 1, wherein:

module supports (21) are successively provided in each of the modules areas (S2) at intervals, and a plurality of module circuit boards (20) that are connected to the module supports (21) via module connection portions (22) is formed in spaces between the module supports (21); and a plurality of machine holes (30) is provided along each of the cut lines that divide the module supports (21) and the module circuit boards (20) from each other, via holes (40) are formed by plating inner circumferential surfaces of the machine holes (30) with metal layers (35) in order to conduct electricity, and V-cut grooves (50) are formed along each of the cut lines.

3. The microcontroller board of claim 1, wherein the metal layers (35) with which the inner circumferential surfaces of the machine holes (30) are plated are made of any one of copper-, silver-, gold-, nickel-, and carbon-series materials applied using an electrolytic or electroless plating method.

* * * * *